(12) United States Patent
Yoon

(10) Patent No.: US 7,550,349 B2
(45) Date of Patent: Jun. 23, 2009

(54) METHOD FOR FORMING GATE DIELECTRIC LAYERS

(75) Inventor: Chul Jin Yoon, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 162 days.

(21) Appl. No.: 11/637,705

(22) Filed: Dec. 13, 2006

(65) Prior Publication Data

US 2007/0132041 A1 Jun. 14, 2007

(30) Foreign Application Priority Data

Dec. 14, 2005 (KR) .................... 10-2005-0123317

(51) Int. Cl.
*H01L 21/336* (2006.01)

(52) U.S. Cl. .................... 438/257; 438/258; 438/261; 438/981

(58) Field of Classification Search ................ 438/257, 438/258, 261, 287, 981; 257/411
See application file for complete search history.

(56) References Cited

U.S. PATENT DOCUMENTS

2005/0023604 A1* 2/2005 Kim et al. .................... 257/316
2006/0223266 A1* 10/2006 Lim et al. .................... 438/275

FOREIGN PATENT DOCUMENTS

CN 1620718 5/2005
WO WO 03/073491 9/2003

OTHER PUBLICATIONS

Office Action issued on May 9, 2008, from the State Intellectual Property Office of the People's Republic of China in counterpart Chinese Application No. 200610168809.0.

* cited by examiner

*Primary Examiner*—Ha Tran T Nguyen
*Assistant Examiner*—Daniel Whalen
(74) *Attorney, Agent, or Firm*—Finnegan, Henderson, Farabow, Garrett & Dunner, L.L.P.

(57) ABSTRACT

A method for forming gate dielectric layers having different thicknesses is provided, The method includes forming a lower oxide layer, a nitride layer, and an upper oxide layer on a semiconductor substrate; performing a first deglaze process to the semiconductor substrate keeping the lower oxide layer, the nitride layer, and the upper oxide layer in a first region, while removing the nitride layer and the upper oxide layer in second, third, and fourth regions; forming the first gate dielectric layer having a first thickness in the second, third, and fourth regions; performing a second deglaze process to the first gate dielectric layer in the third region, thereby forming a second gate dielectric layer having a second thickness; and performing a third deglaze process on the first gate dielectric layer on the fourth region, thereby forming a third gate dielectric layer having a third thickness.

4 Claims, 3 Drawing Sheets under the condition that other factors are constant throughout this specification. It also should be understood that when a layer is referred to as being "on" another layer or substrate, it can be directly on the other layer or substrate, or intervening layers may also be present.

METHOD FOR FORMING GATE DIELECTRIC LAYERS

RELATED APPLICATION

This application is based upon and claims the benefit of priority to Korean Application No. 10-2005-0123317, filed on Dec. 14, 2005, the entire contents of which are incorporated herein by reference.

TECHNICAL FIELD

The present invention relates to a semiconductor device, and more specifically, to a method for forming gate dielectric layers having different thicknesses, capable of improving hump characteristics of logic devices in an embedded device.

BACKGROUND

An embedded device including a SONOS (Silicon-Oxide-Nitride-Oxide-Silicon) device has various kinds of transistors as its main constituent elements. Such constituent transistors need gate dielectric layers having different thicknesses. To this end, gate dielectric layers having suitable thicknesses are formed by performing an oxidation process two or three times, and repeatedly performing a deglaze process for selectively removing a part of an oxide layer.

However, the repeatedly performed deglaze process may cause a severe loss in the edge of STI (shallow trench isolation) film of some devices, such as a low voltage logic transistor device. This is the so-called hump phenomenon. Such a hump phenomenon causes current leakage in a device, resulting in malfunctioning of the device.

For example, an ONO (Oxide/Nitride/Oxide) is deposited to form an ONO layer, and a photoresist for a SONOS transistor is coated. Upper oxide and nitride layers of an ONO layer are removed in the deglaze process, and an oxide layer for a high voltage transistor to program the SONOS device is formed by performing the oxidation process again. Then, regions other than an ultraviolet (UV) region are deglazed. At this time, a loss of STI film occurs in the high voltage region and the low voltage logic region.

Then, an oxide layer for the high voltage logic transistor is formed by performing the oxidation process, and regions other than the high voltage region are deglazed. At this time, the loss of STI film in the low voltage logic region occurs again. Next, an oxidation process is performed to form an oxidation layer for the low voltage logic transistor.

Accordingly, since the deglaze process is performed once in the high voltage device region and at lease two times in the low voltage region, there is accompanied a loss of gap filled oxide, such as an NSG oxide, for the STI film.

FIGS. 1 and 2 are sectional views schematically illustrating a loss of device film caused by a conventional deglaze process.

Referring to FIG. 1, a STI film 15 and a gate dielectric layer 20 are sequentially formed on a semiconductor substrate 10. Subsequently, as shown in FIG. 2, by performing a process to control the thickness of gate dielectric layer 20, for example, by performing a deglaze process repeatedly, an edge 30 of shallow trench isolation 15 is lost, thereby causing a hump phenomenon.

Since such a hump phenomenon causes current leakage of a device, thereby malfunctioning the device, it is thus required to prevent the loss of edge 30 of shallow trench isolation 15. That is, it is strongly needed to develop a method for forming gate dielectric layers having different thicknesses without causing the hump phenomenon.

SUMMARY

Consistent with the present invention, there is provided a method for forming gate dielectric layers.

In accordance with a preferred embodiment, there is provided a method for forming gate dielectric layers, including: forming a first gate dielectric layer having a first thickness on a semiconductor substrate; performing a first deglaze process in a first region of the first gate dielectric layer, thereby forming a second gate dielectric layer having a second thickness; and performing a second deglaze process in a second region of the first gate dielectric layer, thereby forming a third gate dielectric layer having a third thickness.

In accordance with another preferred embodiment, there is provided a method for forming gate dielectric layers, including: forming a lower oxide layer, a nitride layer, and an upper oxide layer on a semiconductor substrate, the semiconductor substrate including a first region on which a SONOS transistor is formed, a second region on which a high voltage logic transistor for the SONOS transistor is formed, a third region on which a high voltage logic transistor is formed, and a fourth region on which a low voltage logic transistor is formed; performing a first deglaze process to the semiconductor substrate keeping the lower oxide layer, the nitride layer, and the upper oxide layer in the first region, while removing the nitride layer and the upper oxide layer in the second, third, and fourth regions; forming the first gate dielectric layer having a first thickness on the second, third, and fourth regions; performing a second deglaze process to the first gate dielectric layer in the third region, thereby forming a second gate dielectric layer having a second thickness less than the first thickness; and performing a third deglaze process to the first gate dielectric layer in the fourth region, thereby forming a third gate dielectric layer having a third thickness less than the second thickness.

BRIEF DESCRIPTION OF THE DRAWINGS

The above features of the present invention will become apparent from the following description of preferred embodiments given in conjunction with the accompanying drawings, in which:

As shown in FIG. 7, semiconductor substrate 100 includes a first region 101 in which a SONOS transistor 401 is formed, a second region 102 in which a high voltage logic transistor 402 for SONOS transistor 401 is formed, a third region 103 in which a high voltage logic transistor 403 is formed, and a fourth region 104 in which a low voltage logic transistor 404 is formed.

DETAILED DESCRIPTION

Hereinafter, preferred embodiments consistent with the present invention will be described in detail with reference to the accompanying drawings so that they can be readily implemented by those skilled in the art.

Consistent with an embodiment of the present invention, when forming a device, such as an embedded device, comprised of various kinds of transistors, gate dielectric layers having different thicknesses for each transistor device are formed. First, an oxide layer, which is the thickest layer, is formed by an oxidation process, and is sequentially deglazed according to specific thickness requirements of different regions. At this time, by performing the deglaze processes selectively required in each region, the shallow trench isolation in a specific region is prevented from being lost due to the deglaze process in other region.

FIGS. 3 to 6 are sectional views schematically illustrating a method for forming gate dielectric layers having different thicknesses, consistent with an embodiment of the present invention.

Figure 1:
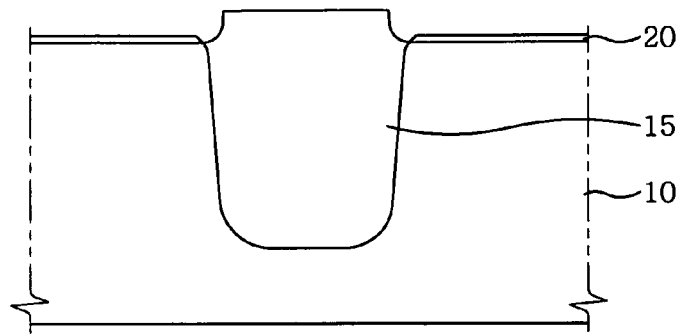
FIGS. 1 and 2 are sectional views schematically illustrating a loss of a device film caused by a conventional deglaze process.
Figure 2:
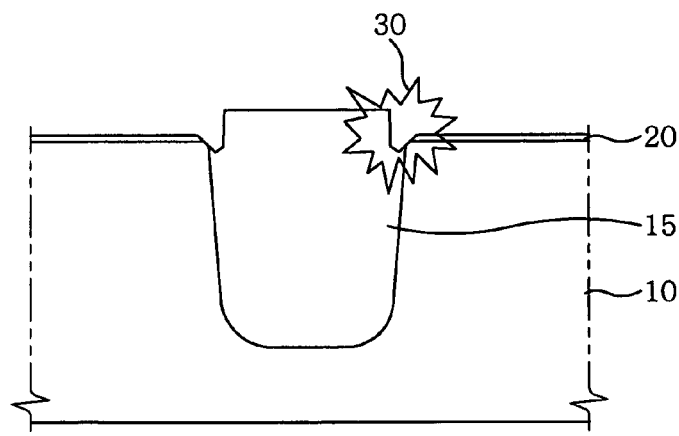
Figure 3:
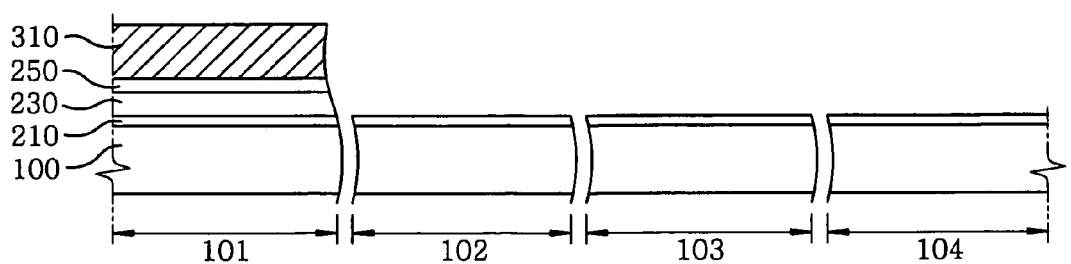
FIGS. 3 to 6 are sectional views schematically illustrating a method for forming gate dielectric layers having different thicknesses consistent with an embodiment of the present invention.

Referring to FIG. 3, in order to realize an embedded device on a semiconductor substrate 100, there are reserved a first region 101 on which a SONOS transistor will be formed, a second region 102 on which a high voltage logic transistor for the SONOS transistor will be formed, a third region 103 on which a high voltage logic transistor will be formed, and a fourth region 104 on which a low voltage logic transistor will be formed.

Next, formed on the semiconductor substrate are an ONO layer 200 comprised of a lower oxide layer 210, a nitride layer 230, and an upper oxide layer 250. A first photoresist pattern 310 is formed over ONO layer 200 in first region 101. Then, in second, third, and fourth regions 102, 103, 104, a first deglaze process is performed where nitride layer 230, and upper oxide layer 250 are removed to expose lower oxide layer 210. However, lower oxide layer 210, nitride layer 230, and upper oxide layer 250 remain in first region 101, thereby forming a data storage node of the SONOS transistor.

Figure 4:
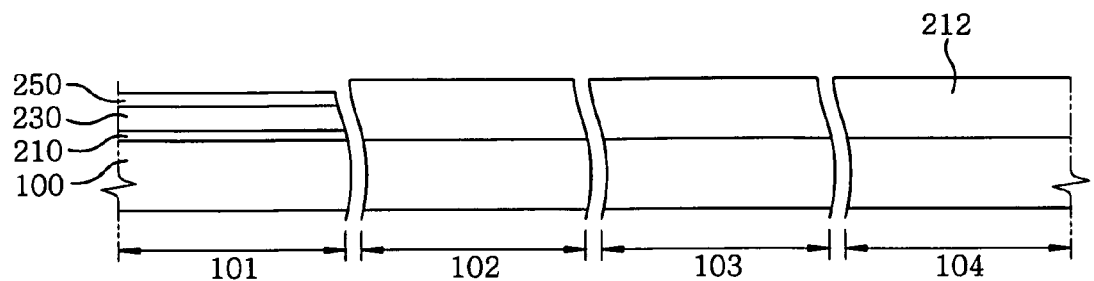

Referring to FIG. 4, a first gate dielectric layer 212 having a first thickness is grown on the exposed lower oxide layer 210 through an oxidation process, or the like.

Figure 5:
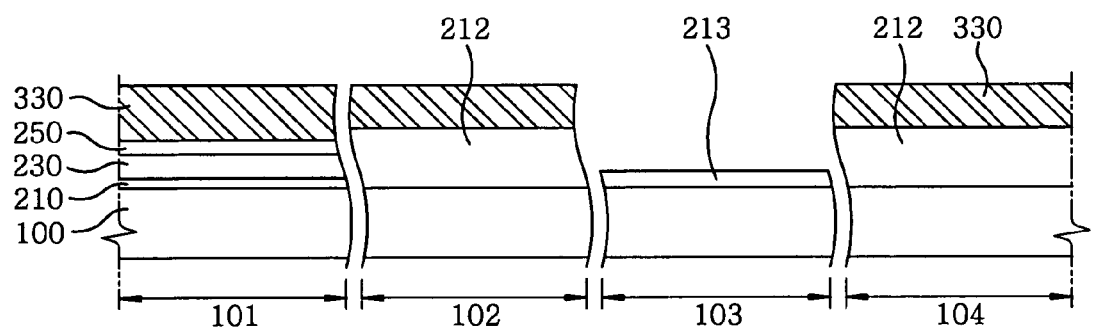

Referring to FIG. 5, a second deglaze process is performed, where a second photoresist pattern 330 is formed to selectively expose third region 103. Thus, first gate dielectric layer 212 on the exposed third region 103 is removed partially in a depth direction. As a result, a second dielectric layer 213 having a second thickness less than the first thickness selectively remains on third region 103.

Figure 6:
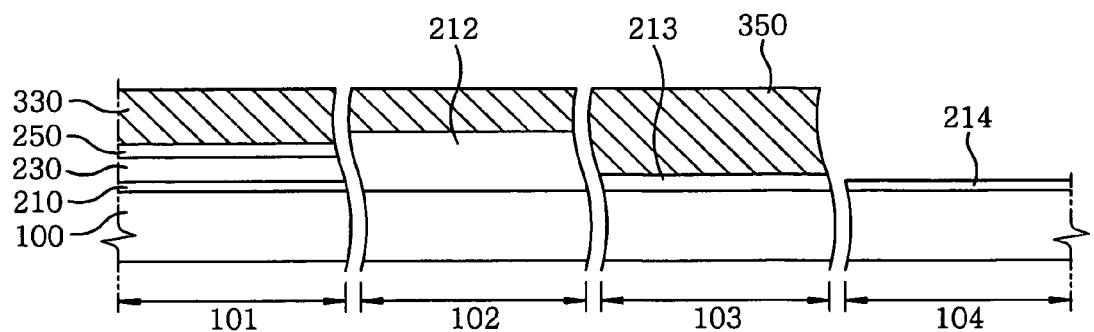
Figure 7:
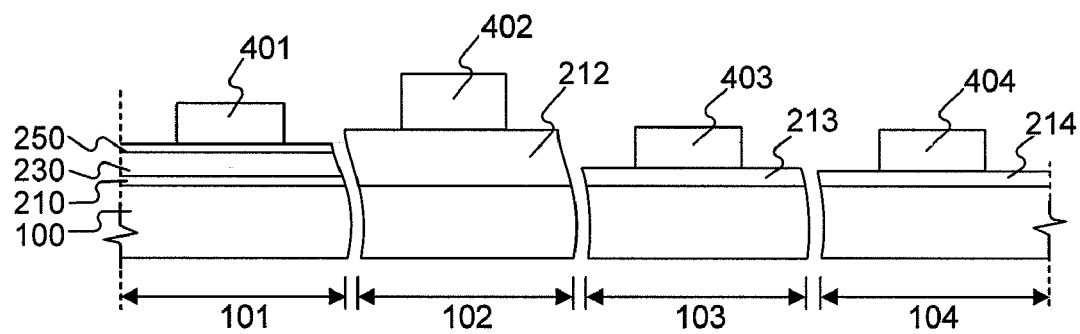
FIG. 7 is a sectional view illustrating a semiconductor substrate 100 consistent with the present invention.

Referring to FIG. 6, a third deglaze process is performed, where a third photoresist pattern 350 is formed to selectively expose fourth region 104. Thus, first gate dielectric layer 212 on the exposed fourth region 104 is removed partially in a depth direction. As a result, a third gate dielectric layer 214 having a third thickness larger than the second thickness is selectively formed on fourth region 104.

In this regard, the first, the second, or the third deglaze process, especially, the second or the third deglaze process, may be performed using a wet etching process using a buffer oxide etchant (BOE) or a buffered hydrofluoric acid (BHF), thereby etching an oxide. Alternatively, a sulphuric acid ($H_2SO_4$) may be used.

Since it is well known in the art that an etching uniformity of 1% BHF is 1.4%, uniformities of gate dielectric layers 212, 213, and 214 may be fully obtained by performing the etching processes. In addition, since a process error of gate dielectric layers in the high or low voltage transistor devices ranges approximately from 6 to 8%, gate dielectric layers 212, 213, and 214 having satisfactory uniformity may be provided using such etching processes.

As described above, when forming three kinds of gate dielectric layers having different thicknesses, one may perform an oxidation process once, and selectively perform deglaze processes twice.

Moreover, since the deglaze process is performed once in each of the gate dielectric layers, the deglaze process is not performed two or more times in a specific region.

Accordingly, a severe hump phenomenon, resulting from a lost edge of shallow trench isolation (STI) film, caused by the severe deglaze process may be prevented effectively.

While the invention has been described with respect to the preferred embodiments, it will be understood by those skilled in the art that various changes and modifications may be made without departing from the spirit and scope of the invention as defined in the following claims.

What is claimed is:

1. A method for forming gate dielectric layers having different thicknesses, comprising:

forming a lower oxide layer, a nitride layer, and an upper oxide layer on a semiconductor substrate, the semiconductor substrate including a first region in which a SONOS transistor is to be formed, a second region in which a high voltage logic transistor for the SONOS transistor is to be formed, a third region in which a high voltage logic transistor is to be formed, and a fourth region in which a low voltage logic transistor is to be formed;

performing a first deglaze process on the semiconductor substrate keeping the lower oxide layer, the nitride layer, and the upper oxide layer in the first region, while removing the nitride layer and the upper oxide layer in the second, third, and fourth regions to expose the lower oxide layer in the second, third, and fourth regions;

growing a first gate dielectric layer having a first thickness on the exposed lower oxide layer in the second, third, and fourth regions;

performing a second deglaze process on the first gate dielectric layer in the third region, thereby forming a second gate dielectric layer having a second thickness; and performing a third deglaze process on the first gate dielectric layer in the fourth region, thereby forming a third gate dielectric layer having a third thickness.

2. The method of claim 1, wherein performing the second or the third deglaze process comprises:

exposing the third or the fourth region of the gate dielectric layer using a photoresist pattern as an etching mask; and wet-etching the third or the fourth region of the first gate dielectric layer exposed by the etching mask.

3. The method of claim 2, wherein the third or the fourth region of the first gate dielectric layer is wet-etched by a buffer oxide etchant (BHF).

4. The method of claim 1, wherein the first, the second, and the third thickness are different from each other.

* * * * *